US011322844B2

(12) United States Patent
Nikolayenkov et al.

(10) Patent No.: US 11,322,844 B2
(45) Date of Patent: *May 3, 2022

(54) IMPEDANCE COMPENSATION SYSTEM WITH MICROSTRIP AND SLOTLINE COUPLING AND CONTROLLABLE CAPACITANCE

(71) Applicant: NXP USA, Inc., Austin, TX (US)

(72) Inventors: Oleksandr Nikolayenkov, Toulouse (FR); Geoffrey Tucker, Tempe, AZ (US); Martin Beuttner, Toulouse (FR)

(73) Assignee: NXP USA, Inc., Austin, TX (US)

( * ) Notice: Subject to any disclaimer, the term of this patent is extended or adjusted under 35 U.S.C. 154(b) by 125 days.

This patent is subject to a terminal disclaimer.

(21) Appl. No.: 16/838,671

(22) Filed: Apr. 2, 2020

(65) Prior Publication Data
US 2020/0343636 A1 Oct. 29, 2020

(30) Foreign Application Priority Data
Apr. 23, 2019 (EP) ..................................... 19305519

(51) Int. Cl.
H01Q 5/335 (2015.01)
H01P 3/02 (2006.01)
(Continued)

(52) U.S. Cl.
CPC ............. H01Q 5/335 (2015.01); H01P 3/023 (2013.01); H01P 3/081 (2013.01); H01Q 23/00 (2013.01)

(58) Field of Classification Search
CPC .................................. H01P 3/023; H01P 3/081
See application file for complete search history.

(56) References Cited

U.S. PATENT DOCUMENTS 4,533,886 A * 8/1985 Cornish ................. H03B 19/18
327/493
4,636,757 A 1/1987 Harrison et al.
(Continued)

FOREIGN PATENT DOCUMENTS

EP 2416494 A2 2/2012
EP 2416494 A3 2/2012

OTHER PUBLICATIONS

U.S. Appl. No. 17/107,339, filed Nov. 30, 2020, 31 pages.
(Continued)

Primary Examiner — Stephen E. Jones
Assistant Examiner — Kimberly E Glenn

(57) ABSTRACT

Embodiments of a circuit, system, and method are disclosed. In an embodiment, a circuit includes a first microstrip transmission line, a second microstrip transmission line, and a slotline formation, wherein the slotline formation extends between the first microstrip transmission line and the second microstrip transmission line so that the slotline formation is configured to electromagnetically couple the first microstrip transmission line to the second microstrip transmission line during operation of the circuit. In addition, the circuit includes at least one controllable capacitance circuit electrically connected to at least one of the first microstrip transmission line and the second microstrip transmission line, wherein a magnitude of capacitance of the at least one controllable capacitance circuit is controllable (e.g., in response to a capacitance control signal received at a control interface).

17 Claims, 14 Drawing Sheets

(51) Int. Cl.
*H01P 3/08* (2006.01)
*H01Q 23/00* (2006.01)

(56) References Cited

U.S. PATENT DOCUMENTS

| | | | |
|---|---|---|---|
| 5,075,647 A * | 12/1991 | Petter | H01P 5/20 |
| | | | 333/121 |
| 9,130,534 B2 | 9/2015 | Schmidhammer et al. | |
| 9,755,576 B2 | 9/2017 | Perreault et al. | |
| 2012/0295554 A1 | 11/2012 | Greene et al. | |
| 2014/0028521 A1 | 1/2014 | Bauder et al. | |
| 2019/0115875 A1 | 4/2019 | Nikolayenkov et al. | |

OTHER PUBLICATIONS

U.S. Appl. No. 17/408,655, filed Aug. 23, 2021.
Caspers, F.; "RF Engineering basic concepts: S-parameters"; Cornell University, contribution to the CAS-CERN Accelerator School: Specialised Course on RF for Accelerators, Ebeltoft, Denmark; retrieved from the Internet https://arxiv.org/abs/1201.2346 ; 27 pages (Jun. 8-17, 2010).
Cavendish Kinetics; "SmarTune Antenna Tuner—32CK417R, V2.4"; retrieved from the Internet www.cavendish-kinetics.com; 11 pages (2017).
Knorr, Jeffrey B; "Slot-Line Transitions (Short Papers)"; IEEE Transactions on Microwave Theory and Techniques, vol. 22, No. 5; 7 pages (1974).
Zinieris, M et al; "A Broadband Microstrip-to-Slot-Line Transition"; ResearchGate, Microwave and Optical Technology Letters—Aug. 1998; 5 pages (Jan. 22, 1998).
Malmqvist, R. et al; "RF MEMS and MMIC based Reconfigurable Matching Networks for Adaptive Multi-Band RF Front-Ends"; IEEE International Microwave Workshop on RF Front-ends for Software Defined and Cognitive Radio Solutions (IMWS), Aveiro, Portugal; 4 pages (Feb. 22-23, 2010).
Seman, Norhudah et al; "Microstrip-Slot Transition and Its Applications in Multilayer Microwave Circuits"; Passive Microwave Components and Antennas; 21 pages (2010).
Wang, Y et al; "Double Microstrip-Slot Transitions for Broadband 90° Microstrip Phase Shifters"; IEEE Microwave and Wireless Components Letters, vol. 22, No. 2; IEEE, Piscataway, NJ, USA; 3 pages (Jan. 27, 2012).

* cited by examiner

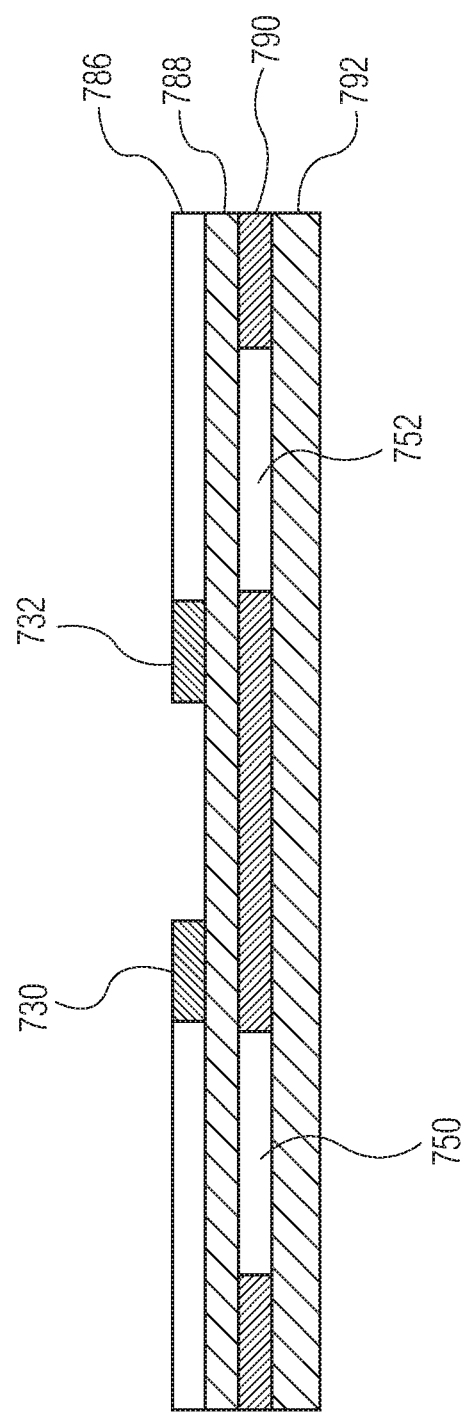

IMPEDANCE COMPENSATION SYSTEM WITH MICROSTRIP AND SLOTLINE COUPLING AND CONTROLLABLE CAPACITANCE

CROSS-REFERENCE TO RELATED APPLICATION

This patent application claims priority under 35 USC 119 to European Patent Application Number 19305519.1, filed on Apr. 23, 2019.

BACKGROUND

Radio Frequency (RF) front-end modules are important components in RF systems, including for base transceiver stations (BTSs) in 5G wireless networks. An important operating parameter that affects the performance of RF front-end modules is antenna impedance mismatch. Various techniques have been used to manage antenna impedance mismatch including, for example, adding an impedance compensation network or an impedance tunable matching network (TMN) between the antenna and other RF components in the RF front-end module. Such impedance compensation networks and impedance tunable matching networks are typically implemented with π and T-structures that are based on sections of variable reactance connected to the microstrip transmission line. These implementations typically rely on bulky components that tend to be highly lossy and that may not scale well at higher powers.

SUMMARY

Embodiments of a circuit, system, and method are disclosed. In an embodiment, a circuit includes a first microstrip transmission line, a second microstrip transmission line, a slotline formation, wherein the slotline formation extends between the first microstrip transmission line and the second microstrip transmission line so that the slotline formation is configured to electromagnetically couple the first microstrip transmission line to the second microstrip transmission line during operation of the circuit, and at least one controllable capacitance circuit electrically connected to at least one of the first microstrip transmission line and the second microstrip transmission line, wherein a magnitude of capacitance of the at least one controllable capacitance circuit is controllable.

In an embodiment, the at least one controllable capacitance circuit includes a first controllable capacitance circuit electrically connected to the first microstrip transmission line and including a first control interface, wherein a magnitude of capacitance of the first controllable capacitance circuit is controllable in response to a first capacitance control signal received at the first control interface and a second controllable capacitance circuit electrically connected to the second microstrip transmission line and including a second control interface, wherein a magnitude of capacitance of the second controllable capacitance circuit is controllable in response to a second capacitance control signal received at the second control interface.

In an embodiment, the first microstrip transmission line includes an open stub and the first controllable capacitance circuit is electrically connected to the first microstrip transmission line at the open stub of the first microstrip transmission line and the second microstrip transmission line includes an open stub and the second controllable capacitance circuit is electrically connected to the second microstrip transmission line at the open stub of the second microstrip transmission line.

In an embodiment, the at least one controllable capacitance circuit is controlled in response to a digital capacitance control signal received at a control interface of the at least one controllable capacitance circuit.

In an embodiment, the at least one controllable capacitance circuit includes a first digitally controllable capacitance circuit electrically connected to the first microstrip transmission line and including a first control interface wherein a magnitude of capacitance of the first digitally controllable capacitance circuit is controllable in response to a first digital capacitance control signal received at the first control interface and a second digitally controllable capacitance circuit electrically connected to the second microstrip transmission line and including a second control interface, wherein a magnitude of capacitance of the second digitally controllable capacitance circuit is controllable in response to a second digital capacitance control signal received at the second control interface.

In an embodiment, a portion of the first microstrip transmission line intersects a portion of the slotline formation from a plan view perspective and wherein a portion of the second microstrip transmission line intersects a portion of the slotline formation from a plan view perspective.

In an embodiment, the first microstrip transmission line includes an open stub and the first microstrip transmission line intersects the portion of the slotline formation near the open stub of the first microstrip transmission line and the second microstrip transmission line includes an open stub and the second microstrip transmission line intersects the portion of the slotline formation near the open stub of the second microstrip transmission line.

In an embodiment, the intersecting portions of the first microstrip transmission line and the slotline formation are separated by a dielectric layer and wherein the intersecting portions of the second microstrip transmission line and the slotline formation are separated by a dielectric layer.

In an embodiment, the slotline formation is formed as a gap in a conductive layer of a printed circuit board (PCB).

In an embodiment, a linear portion of the gap of the slotline formation extends perpendicular to a portion of the first microstrip transmission line and to a portion of the second microstrip transmission line.

In an embodiment, the gap of the slotline formation includes a first rounded end portion at a first end of the linear portion and a second rounded end portion at a second end of the linear portion.

In an embodiment, the first microstrip transmission line includes an L-shaped portion with a first linear portion and a second linear portion that is substantially perpendicular to the first linear portion and wherein the second microstrip transmission line includes an L-shaped portion with a third linear portion and a fourth linear portion that is substantially perpendicular to the third linear portion.

In an embodiment, the first microstrip transmission line includes an open stub and the first microstrip transmission line intersects a portion of the slotline formation near the open stub of the first microstrip transmission line and the second microstrip transmission line includes an open stub and the second microstrip transmission line intersects a portion of the slotline formation near the open stub of the second microstrip transmission line.

In an embodiment, the first microstrip transmission line and the second microstrip transmission line are coplanar.

In an embodiment, the first microstrip transmission line and the second microstrip transmission line are on different planes.

In an embodiment, an RF front-end includes the above-described circuit.

In another embodiment, a system is disclosed. The system includes a first microstrip transmission line, a second microstrip transmission line, a slotline formation, wherein the slotline formation extends between the first microstrip transmission line and the second microstrip transmission line to electromagnetically couple the first microstrip transmission line to the second microstrip transmission line, and at least one controllable capacitance circuit electrically connected to at least one of the first microstrip transmission line and the second microstrip transmission line and including a control interface, wherein a magnitude of capacitance of the at least one controllable capacitance circuit is controllable in response to a capacitance control signal received at the control interface.

In an embodiment, the at least one controllable capacitance circuit includes a first controllable capacitance circuit electrically connected to the first microstrip transmission line and including a first control interface wherein a magnitude of capacitance of the first controllable capacitance circuit is controllable in response to a first capacitance control signal received at the first control interface and a second controllable capacitance circuit electrically connected to the second microstrip transmission line and including a second control interface, wherein a magnitude of capacitance of the second controllable capacitance circuit is controllable in response to a second capacitance control signal received at the second control interface.

A method for providing impedance compensation for an RF front-end is also disclosed. The method involves receiving an RF signal at one of a first microstrip transmission line and a second microstrip transmission line, wherein a slotline formation extends between the first microstrip transmission line and the second microstrip transmission line to electromagnetically couple the first microstrip transmission line to the second microstrip transmission line and adjusting the capacitance at an open stub of at least one of the first microstrip transmission line and the second microstrip transmission line to provide impedance compensation.

In an embodiment, adjusting the capacitance at an open stub of at least one of the first microstrip transmission line and the second microstrip transmission line involves adjusting the capacitance at a first controllable capacitance circuit that is electrically connected to an open stub of the first microstrip transmission line in response to receiving a first capacitance control signal and adjusting the capacitance at a second controllable capacitance circuit that is electrically connected to an open stub of the second microstrip transmission line in response to receiving a second capacitance control signal.

Other aspects in accordance with the invention will become apparent from the following detailed description, taken in conjunction with the accompanying drawings, illustrated by way of example of the principles of the invention.

BRIEF DESCRIPTION OF THE DRAWINGS

FIG. 7B is a side cutaway view of the component of FIG. 7A at cross section A-A.

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
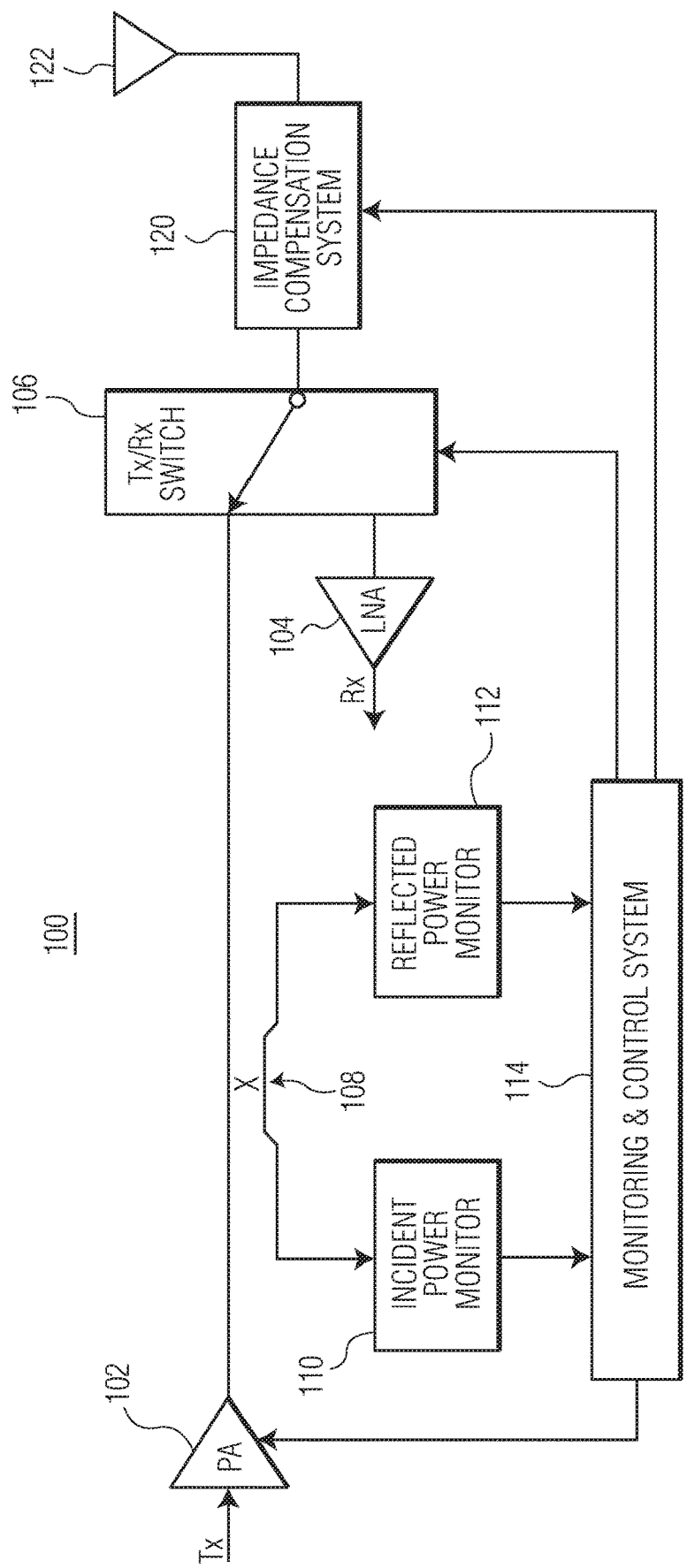
FIG. 1 is a block diagram of an example RF front-end that includes an impedance compensation system.

FIG. 1 is a block diagram of an example RF front-end 100 that includes a transmit signal power amplifier (PA) 102, a receive signal low noise amplifier (LNA) 104, a transmitter/receiver switch (Tx/Rx switch) 106, a directional coupler 108, an incident power monitor 110, a reflected power monitor 112, a monitoring and control system 114, an impedance compensation system 120, and an antenna 122. In a transmit operation, the Tx/Rx switch is set to a transmit state (as shown in FIG. 1) and a transmit signal (Tx) is passed to the power amplifier, through or past the directional coupler through the Tx/Rx switch, through the impedance compensation system, and to the antenna for transmission as RF signals. In a receive operation, the Tx/Rx switch would be set to a receive state (not shown in FIG. 1) and a receive signal (Rx) would be passed from the antenna, through the impedance compensation system, through the switch, and to the low noise amplifier. During transmit operation, incident power and reflected power can be monitored by the incident power monitor and by the reflected power monitor, respectively, via the directional coupler. The monitoring and control system can control aspects of the power amplifier, the Tx/Rx switch, and the impedance compensation system through control signals and may control the impedance compensation system in response to power information from the incident power monitor and/or power information from the reflected power monitor. In an embodiment and as is described in more detail below, the monitoring and control system provides a digital capacitance control signal to the impedance compensation system to compensate for antenna impedance mismatch.

In accordance with an embodiment of the invention, a circuit is disclosed. The circuit may be used in an RF front-end to provide impedance compensation for antenna impedance mismatch. In an embodiment, the circuit includes a first microstrip transmission line, a second microstrip transmission line, and a slotline formation. The slotline formation extends between the first microstrip transmission line and the second microstrip transmission line, and the slotline formation is electromagnetically coupled to ends of both the first microstrip transmission line and the second microstrip transmission line. The circuit also includes at least one controllable capacitance circuit electrically connected to at least one of the first microstrip transmission line and the second microstrip transmission line and including a control interface, wherein a magnitude of capacitance of the at least one controllable capacitance circuit is controllable in response to a capacitance control signal received at the control interface. In an embodiment, a first controllable capacitance circuit is electrically connected to an open stub of the first microstrip transmission line, and a second controllable capacitance circuit is electrically connected to an open stub of the second microstrip transmission line, and the magnitudes of the capacitances are digitally controlled. In an embodiment, from a plan view perspective, a portion of the first microstrip transmission line intersects or passes over, but is not directly electrically connected to, a portion of the slotline formation to create a microstrip-to-slotline transition, and a portion of the second microstrip transmission line intersects or passes over, but is not directly electrically connected to, a different portion of the slotline formation to create a slotline-to-microstrip transition. Employing a microstrip-to-slotline transition and a slotline-to-microstrip transition with controllable capacitance(s) electrically connected to at least one of the microstrip transmission lines enables dynamic impedance compensation to be implemented with compact components in a manner that provides a wide dynamic range of adjustability over a wide frequency range. For example, a system implementing such a circuit may be adjusted over an instantaneous bandwidth of approximately 200 megahertz (MHz), although adjustments over narrower or wider bandwidths also may be achieved.

Figure 2:
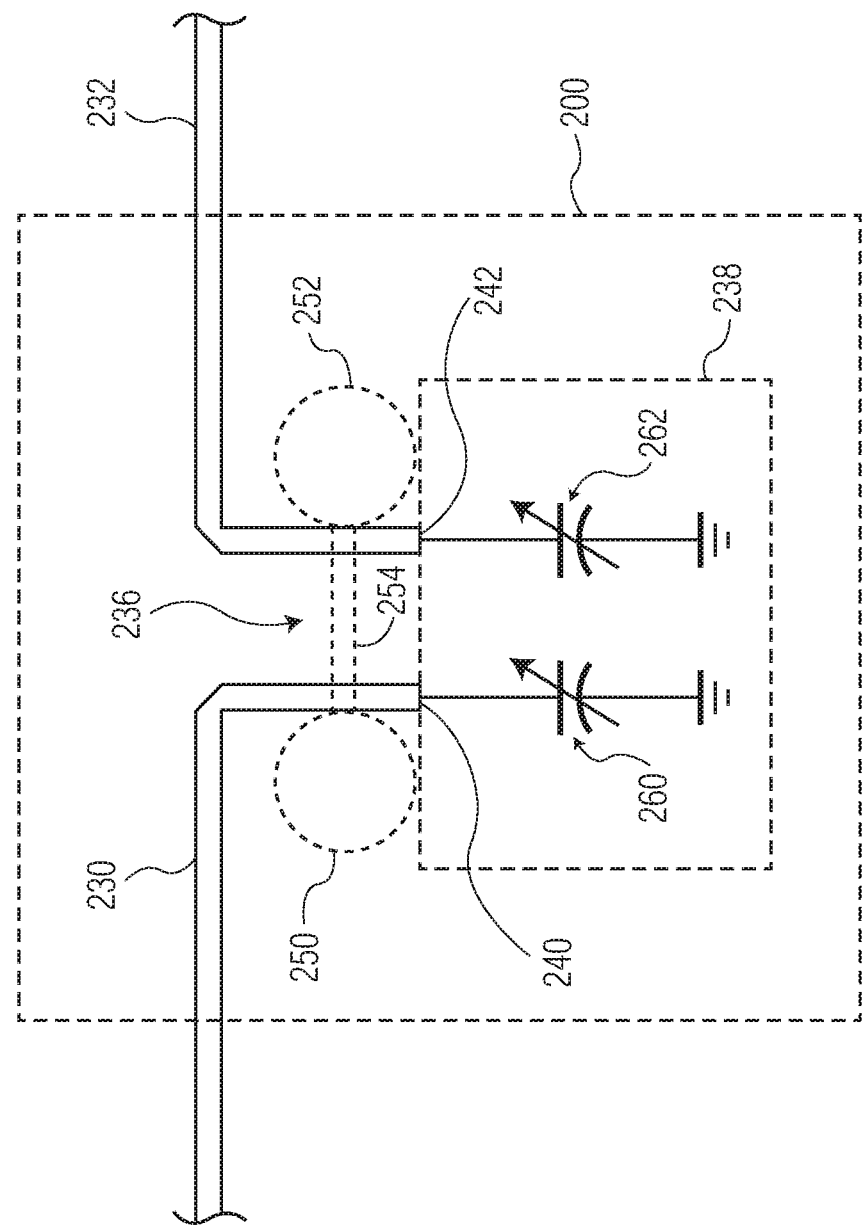
FIG. 2 depicts a circuit that can be used in the RF front-end of FIG. 1 to provide compensation for antenna impedance mismatch.

FIG. 2 depicts a circuit 200 (e.g., impedance compensation system 120, FIG. 1) that can be used in, for example, an RF front-end to provide compensation for antenna impedance mismatch. The circuit includes a first microstrip transmission line 230, a second microstrip transmission line 232, a slotline formation 236, and a controllable capacitance circuit 238 that is electrically connected to the first and second microstrip transmission lines. The first and second microstrip transmission lines depicted in FIG. 2 are L-shaped planar microstrip transmission lines of conductive (e.g., metallic) material formed on a multilayer substrate (not shown) that may include a printed circuit board (PCB) with multiple patterned conductive layers and one or more dielectric layers. More specifically, the L-shaped first microstrip transmission line includes a first linear portion, and a second linear portion that extends substantially perpendicularly from the first linear portion at an elbow between the first and second portions. Similarly, the L-shaped second microstrip transmission line includes a third linear portion, and a fourth linear portion that extends substantially perpendicularly from the third linear portion at an elbow between the third and fourth portions. The first and second microstrip transmission lines both may be formed in a first patterned conductive layer of the PCB, or the first and second microstrip transmission lines may be formed in two different patterned conductive layers of the PCB (e.g., one layer above the slotline formation 236, and another layer below the slotline formation 236, in various embodiments). The first microstrip transmission line includes an open stub 240 (i.e., the end of the second linear portion of the first microstrip transmission line roughly in the center of FIG. 2), and the second microstrip transmission line includes an open stub 242 (i.e., the end of the fourth linear portion of the second microstrip transmission line roughly in the center of FIG. 2). In an embodiment, the open stubs 240 and 242 are open circuited stubs as is known in the field.

The slotline formation 236 is formed in a patterned conductive layer of the PCB (referred to below as a "conductive slotline layer") that is different from the layer(s) in which the first and second microstrip transmission lines are formed. The slotline formation 236 includes two circular shaped shorted stubs 250 and 252 connected by an elongated linear portion 254. In an embodiment, the shorted stubs 250 and 252 are short circuited stubs as is known in the field. As shown in FIG. 2, from a plan view perspective, the first microstrip transmission line 230 electromagnetically intersects (i.e., passes over without a direct electrical connection) a first portion of the slotline formation near the open stub 240 of the first microstrip transmission line (e.g., between the elbow of the L-shaped microstrip transmission line and the open stub) and the second microstrip transmission line 232 electromagnetically intersects (i.e., passes over without a direct electrical connection) a second portion of the slotline formation near the open stub 242 of the second microstrip transmission line (e.g., between the elbow of the L-shaped microstrip transmission line and the open stub). As used herein, the term "gap" means a removed portion of a patterned, planar conductive layer. In addition, the term "near," when used in the context of the proximity of a microstrip transmission line to a slotline formation, means at a location of the microstrip transmission line that is between the elbow of the respective L-shaped microstrip transmission line and the open stub. In an embodiment, the slotline formation includes an elongated, substantially-linear gap (i.e., elongated linear portion 254) formed within the conductive slotline layer such as a first conductive layer of a PCB (e.g., a conductive ground layer). For example, the slotline formation includes a linear gap portion extending between a first rounded end gap portion (or simply rounded end or stub 250 and a second rounded end gap portion (or simply rounded end or stub 252), and is formed as a region between a first interior sidewall of the first conductive layer (i.e., the conductive slotline layer), a second interior sidewall of the first conductive layer, a first rounded interior endwall of the first conductive layer, and a second rounded interior endwall of the first conductive layer. For example, the electrical lengths of the shorted stubs 250 and 252 may be about one-quarter of a wavelength of the RF signal provided by/generated by the transmit signal power amplifier (see FIG. 1) during operation, or one-quarter of a wavelength of the fundamental operational frequency of the power amplifier. In various embodiments, the fundamental operational frequency of the power amplifier is in a range of about 800 MHz to about 6 gigahertz (GHz), although the fundamental operational frequency may be lower or higher, as well. In other embodiments, the slotline formation can have other lengths or characteristics including, for example, those described elsewhere herein.

With reference to FIG. 2, the first microstrip transmission line 230 is electrically connected to, for example, other front-end components of an RF front-end, e.g., the Tx/Rx switch 106 and amplifiers 102 and 104 as shown in FIG. 1, and the second microstrip transmission line 232 is electrically connected to, for example, the antenna 122 as shown in FIG. 1. The open stubs 240 and 242 of the first and second microstrip transmission lines are electrically connected (e.g., via conductive metal) to the controllable capacitance circuit 238. Although the first and second microstrip transmission lines 230, 232 are depicted as L-shaped microstrip transmission lines, other shapes of the first and second microstrip transmission lines are possible, e.g., depending on the locations of RF input and output ports. Although the shorted stubs 250 and 252 of the slotline formation are circular shaped in the example of FIG. 2, other shapes of the shorted stubs and/or the slotline formation in general are possible. Additionally, although the slotline formation is shown as being symmetric (e.g., in that the shorted stubs 250, 252 are the same shape and size), the slotline formation may not be symmetric.

Although it may not be apparent from the top plan view of FIG. 2, the first and second microstrip transmission lines 230 and 232 and the slotline formation 236 are physically (and galvanically) separated from each other (e.g., in a vertical direction, that is, in a direction perpendicular to the plane of the drawing sheet) by a dielectric material. Because the microstrip transmission lines are physically separated from the slotline formation by a dielectric material, there is no direct electrical connection (i.e., coupling by which electrical current can be communicated via a conductive material such as metal) between either of the first or second microstrip transmission lines and the slotline formation. Nevertheless, the first and second microstrip transmission lines are electromagnetically coupled to the slotline formation, e.g., through inductive coupling, and accordingly the microstrip transmission lines are electromagnetically coupled to one another through the slotline formation. For example, with regard to the RF energy in transmission (e.g., from the first microstrip transmission line to the second microstrip transmission line), the RF energy encounters a microstrip-to-slotline transition that involves electromagnetic coupling and then a slotline-to-microstrip transition that also involves electromagnetic coupling.

In an embodiment, the controllable capacitance circuit 238 includes variable capacitors (e.g., digitally controllable Micro-Electro-Mechanical Systems (MEMS) capacitors) that are electrically connected to the open stub of each microstrip transmission line, e.g., electrically connected via direct physical contact between conductive elements of each component. For example, a first variable capacitor 260 is electrically connected to the open stub 240 of the first microstrip transmission line 230 and a second variable capacitor 262 is electrically connected to the open stub 242 of the second microstrip transmission line 232. Although in the example of FIG. 2, a controllable capacitor circuit is electrically connected to both the first and second microstrip transmission lines, in other embodiments, at least one of the microstrip transmission lines is not electrically connected to a controllable capacitor circuit. In a case in which at least one of the microstrip transmission lines is not electrically connected to a controllable capacitor circuit, to achieve a minimum insertion loss of the impedance compensation system, open stub impedance at the intersection point should be at or near zero. The impedance of a simple quarter-wavelength open stub desirable is about zero, and the physical length of the stub is approximately equal to one quarter of a wavelength of the RF signal, in an embodiment. Thus, having capacitors connected to each open stub may provide a desired low impedance at the intersection point with a physical stub length that is much shorter than if no capacitor were attached.

In operation, the controllable capacitance circuit 238 is controlled and/or adjusted by a capacitance control signal that is received from, for example, a monitoring and control system (see FIG. 1, monitoring and control system 114). For example, the capacitance control signal is generated by the monitoring and control system in response to monitored incident power and/or in response to monitored reflected power and the capacitance control signal is dynamically adjusted to compensate for antenna impedance mismatch. In an embodiment, the monitoring and control system is configured to implement an optimization algorithm to attempt to achieve maximum incident power or minimum reflected power. For example, a power amplifier (see FIG. 1, PA 102)

supplies maximum power to the antenna (see FIG. 1, antenna 122) only when at the best matched conditions, e.g., when there is minimum reflection from the load ($\Gamma$=0 at antenna). When the antenna is mismatched (e.g., $\Gamma$=0.2), incident power will drop, and the capacitance of the controllable capacitance circuit is adjusted to recover the incident power until antenna mismatch is compensated to provide $\Gamma \rightarrow 0$ at the power amplifier's output. In operation, the power amplifier desirably generates maximum power, and the full generated power will be delivered to the antenna at compensated impedance mismatch conditions.

Figure 3A:
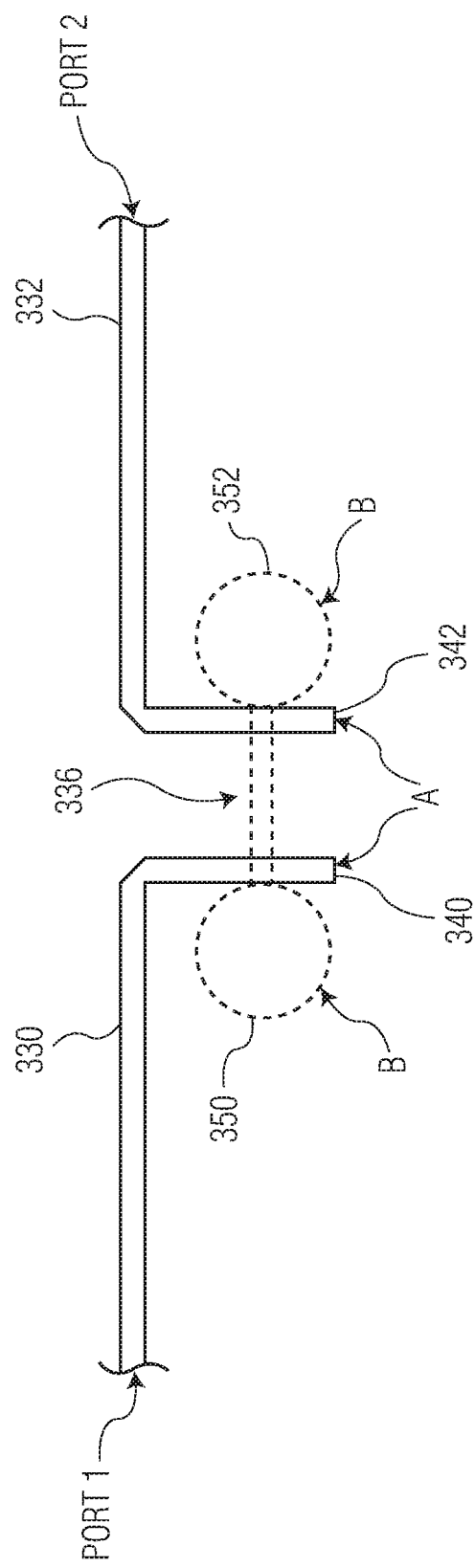
FIG. 3A depicts the first microstrip transmission line, the second microstrip transmission line, and the slotline formation as shown in FIG. 2.
Figure 3B:
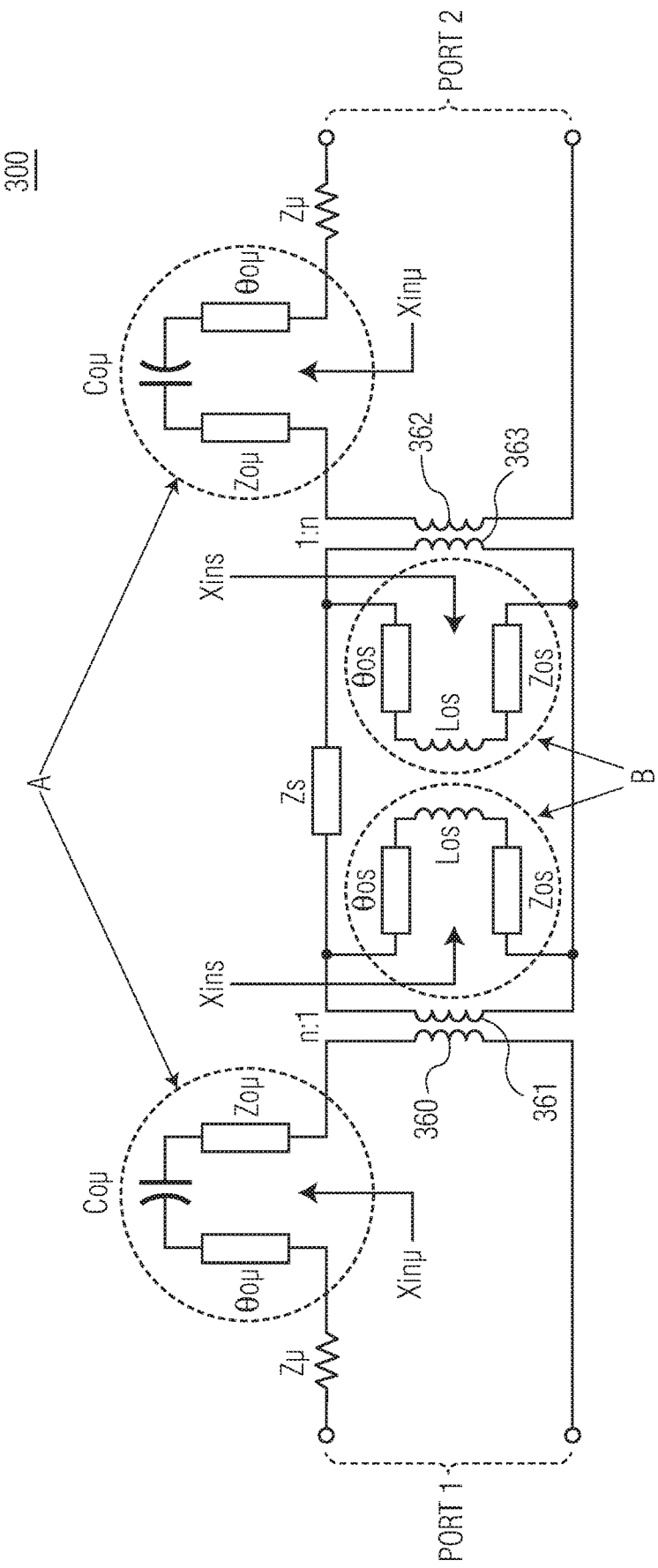
FIG. 3B is an example of an equivalent circuit of the components shown in FIG. 3A.

As described above, the capacitance of the controllable capacitance circuit 238 is controlled to compensate for antenna impedance mismatch. A description of some design and operational theory is provided below with reference to FIGS. 3A-3C. FIG. 3A depicts the first microstrip transmission line 330, the second microstrip transmission line 332, and the slotline formation 336 as shown in FIG. 2, and FIG. 3B is an example of an equivalent circuit 300 of the components shown in FIG. 3A. In FIGS. 3A and 3B, an interface to the first microstrip transmission line is identified as "Port 1" and an interface to the second microstrip transmission line is identified as "Port 2." Components of the equivalent circuit shown in FIG. 3B include:

$Z\mu$—microstrip transmission line characteristic impedance;
$Zo\mu$—microstrip transmission line stub characteristic impedance;
$\Theta o\mu$—microstrip transmission line stub electrical length;
$Co\mu$—microstrip transmission line stub capacitance;
$Zs$—slotline formation characteristic impedance;
$Zos$—slotline formation stub characteristic impedance.
$\Theta os$—slotline formation stub electrical length;
$Los$—slotline formation stub inductance; and
n—transformer turns ratio, which represents the coupling magnitude between the microstrip transmission line and the slotline formation.

Figure 3C:
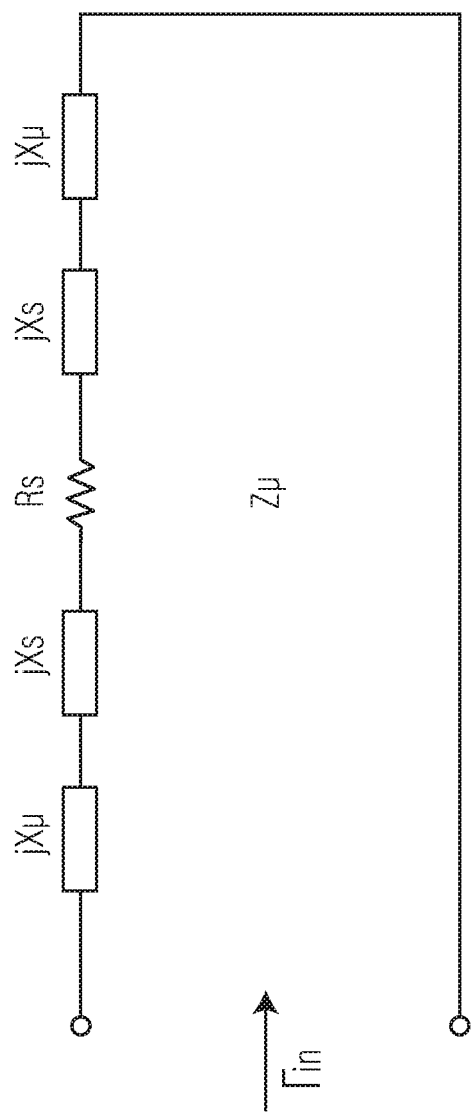
FIG. 3C is an equivalent circuit of the equivalent circuit of FIG. 3B transformed to the Port 1 side.

In the equivalent circuit 300 shown in FIG. 3B, inductive coupling at the first microstrip transmission line-to-slotline formation transition is represented by the transformer formed by inductors 360 and 361 (n:1 coupling), and inductive coupling at the slotline formation-to-second microstrip transmission line transition is represented by the transformer formed by inductors 362 and 363 (1:n coupling). The equivalent circuit elements identified within the dashed circles "A" and corresponding to the microstrip transmission line open stubs 340 and 342 include $Zo\mu$, $\Theta o\mu$, and $Co\mu$ and the equivalent circuit elements identified within the dashed circles "B" and corresponding to the slotline formation shorted stubs 350 and 352 include $Zos$, $\Theta os$, and $Los$. Using the equivalent circuit and transforming the circuit's components to the Port 1 side (e.g., first microstrip transmission line), an equivalent circuit 301 as shown in FIG. 3C is derived, where:

$$Rs = \frac{n^2 Zs Xins}{Zs^2 + Xins} \quad (1)$$

$$Xs = \frac{n Zs Xins}{Zs^2 + Xins} \quad (2)$$

$$X\mu = Xin\mu \quad (3)$$

In FIG. 3C, the "j" represents the imaginary part of the transmission line complex characteristic impedance. Thus, "$jX\mu$" is the imaginary part of the microstrip transmission line characteristic impedance and "$jXs$" is the imaginary part of slotline formation characteristic impedance.

If both microstrip transmission line open stubs 340 and 342 are identical and both slotline formation shorted stubs 350 and 352 are identical, the input reflection coefficient, $\Gamma in$, can be expressed as:

$$\Gamma in = \frac{Rs - Z\mu - j2(X\mu + Xs)}{Rs + Z\mu + j2(X\mu + Xs)} \quad (4)$$

and $$n = \frac{Xin\mu}{Xins} \quad (5)$$

where $n$ is ratio of microstrip line characteristic impedance to slotline characteristic impedance at intersect point.

Therefore, varying of microstrip transmission line open stub parameter $Xin\mu$ in equation (3) and the transformer turn ratio $n$ in equations (2) and (3), the Port 2 impedance can be compensated at Port 1 in a wide range of impedances and instantaneous RF bandwidths. That is, the input reflection coefficient, $\Gamma in$ (equation 4), can be controlled by varying the microstrip transmission line stub capacitance, $Co\mu$. Thus, by changing the microstrip transmission line stub capacitance, $Co\mu$., $Rs$ (equation 1), $Xs$ (equation 2), $X\mu$ (equation 3), and the transformer turn ratio $n$ (equation 5) can be controlled. Although both microstrip transmission line open stubs 340, 342 may be identical (e.g., have identical electrical and/or physical characteristics), it should be understood that the microstrip transmission line open stubs 340, 342 need not be identical, in some embodiments.

Figure 4:
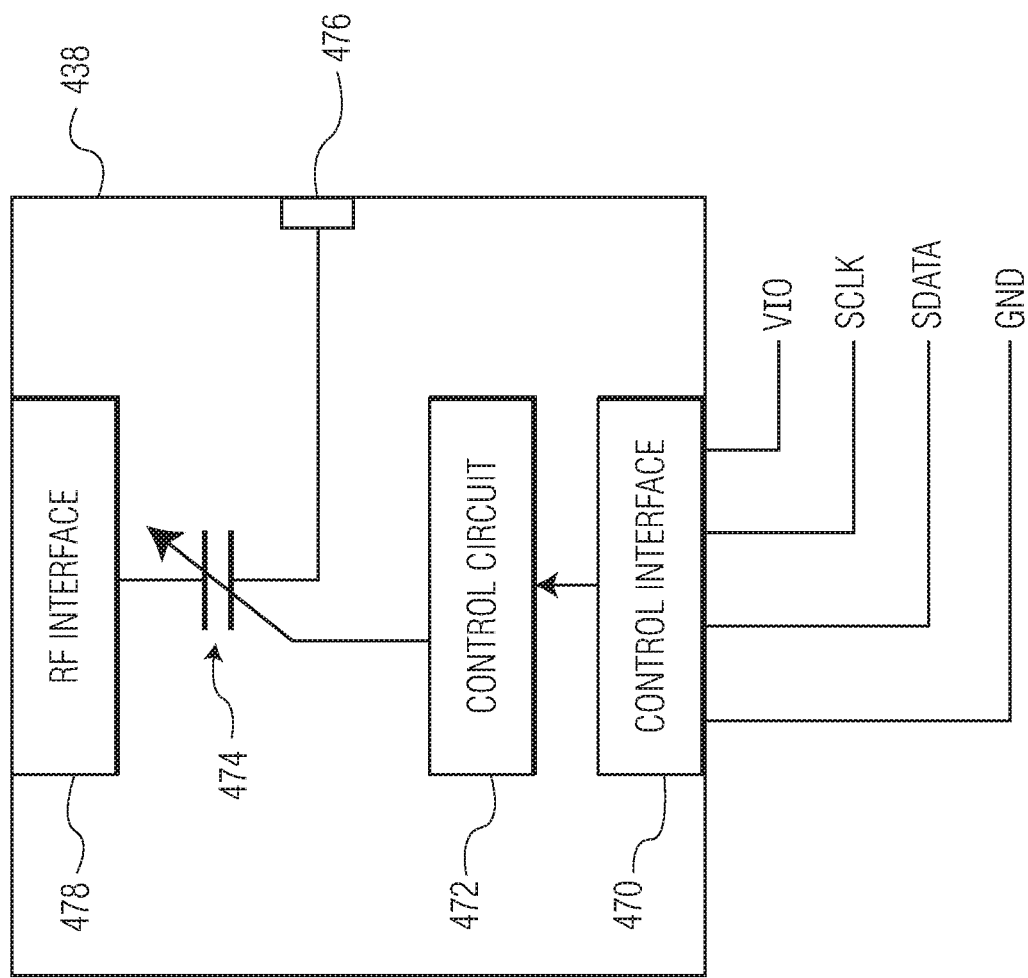
FIG. 4 depicts an embodiment of a digitally controllable capacitor that can be used as at least one component of the controllable capacitance circuit as shown in FIG. 2.

FIG. 4 depicts an embodiment of a digitally controllable capacitor 438 that can be used as at least one component of the controllable capacitance circuit 238 as shown in FIG. 2. The digitally controllable capacitor includes a control interface 470, a control circuit 472, an adjustable (variable) capacitor 474 (e.g., an adjustable MEMS capacitor), an RF ground interface 476 (RFGND), and an RF interface 478. In the example of FIG. 4, the control interface includes a voltage input (VIO), a clock signal input (SCLK), a control data input (SDATA), and a ground interface (GND), and the magnitude of the capacitance of capacitor 474 can be controlled in response to a digital value of the control data input (SDATA). In an embodiment, the RF interface 478 of the digitally controllable capacitor is a conductive element that is physically and electrically connected to the open stub of one of the microstrip transmission lines, e.g., coupled to the end of one of lines 330, 332 with conductive material such as conductive solder that physically bonds and galvanically connects the open stub of the microstrip transmission line to the RF interface of the digitally controllable capacitor. The ground interface 476 may be physically and electrically connected to a ground reference voltage (e.g., system ground). Digitally controllable capacitors that include, for example, adjustable MEMS capacitors are known in the field. In an embodiment, the digitally controllable capacitor may be a discretely-packaged semiconductor device (e.g., with a physical size on the order of 1-1.5 mm×1-1.5 mm and 0.4-0.5 mm thick) that is surface mounted to the PCB. In an example embodiment, the capacitor 474 may have an adjustable capacitance in the range of 0.5-1.6 picofarads (pF) and a quality factor (Q) of about 400 at about 700 MHz. In alternate embodiments, capacitor 474 may have a wider, narrower, and/or different range of capacitance, and/or higher or lower Q.

Figure 5:
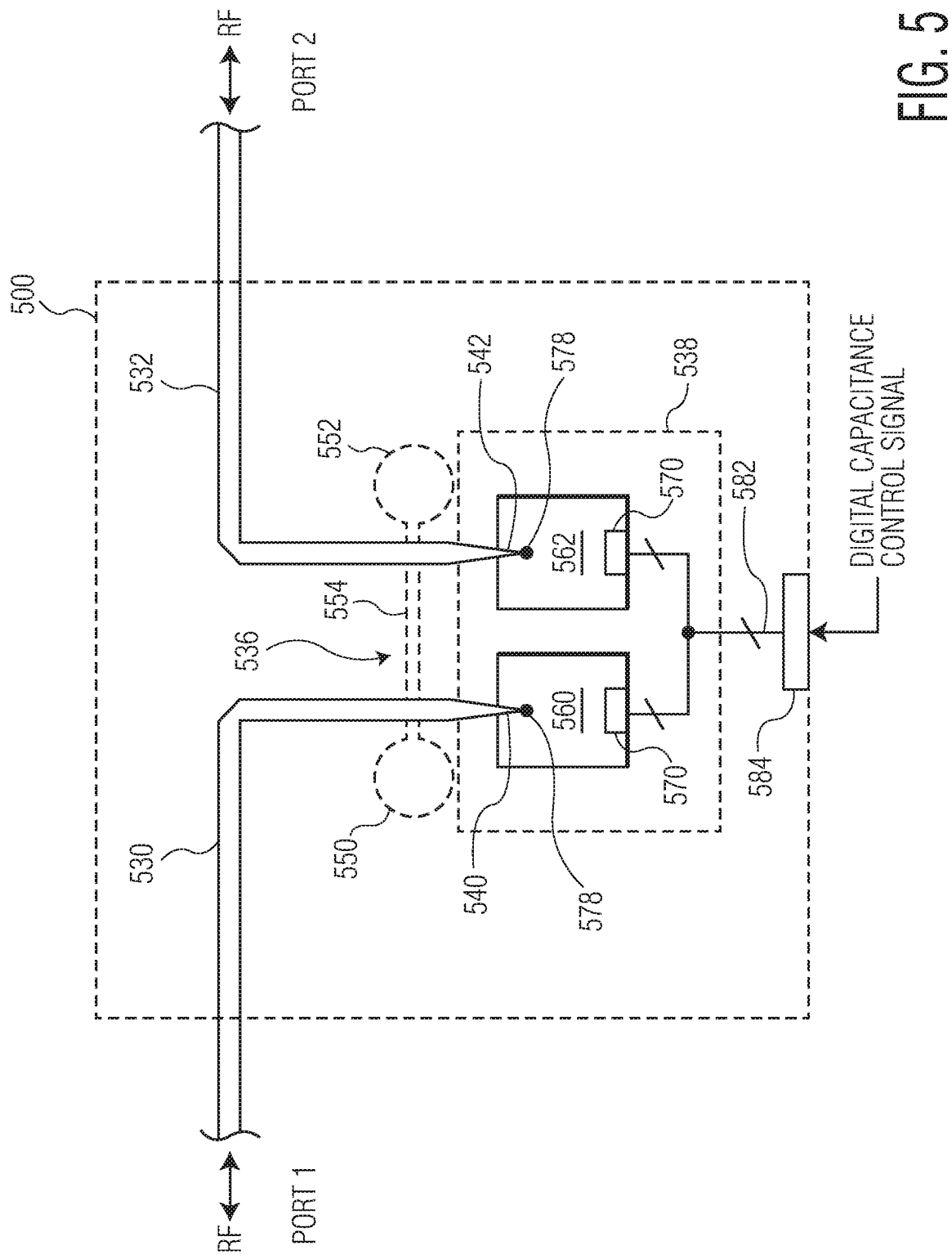
FIG. 5 depicts an embodiment of a system that is configured to provide compensation for antenna impedance mismatch in an RF front-end.

FIG. 5 depicts an embodiment of a system 500 that is configured to provide compensation for antenna impedance mismatch in an RF front-end as described above with reference to FIGS. 1-4. In the embodiment of FIG. 5, the system, referred to as an "impedance compensation system," includes a first microstrip transmission line 530, a second microstrip transmission line 532, a slotline formation 536, and a controllable capacitance circuit 538 similar to the circuit described with reference to FIGS. 2-4. In the example of FIG. 5, the controllable capacitance circuit includes digitally controllable capacitors 560 and 562, such as two instances of the digitally controllable capacitor circuit described above with reference to FIG. 4, each of which is electrically connected to one of the open stubs 540 and 542 of the first and second microstrip transmission lines 530 and 532 at the respective RF interface 578. The control interface 570 of each digitally controllable capacitor 560, 562 is connected to a distinct control signal line 582, and each control signal line is connected to a system control interface 584, through which digital capacitance control signals can travel. In operation, the capacitances at the open stubs of the microstrip transmission lines are controlled in response to the digital capacitance control signals to compensate for antenna impedance mismatch. For example, the capacitances of the adjustable capacitors are independently controlled and/or adjusted in response to the digital capacitance control signals that are, for example, received from a monitoring and control system of an RF front-end (see FIG. 1). In an embodiment, the digital capacitance control signals include transition-specific controls signals that are used to independently control the first digitally controllable capacitor 560 connected to the first microstrip transmission line-to-slotline formation transition and the second digitally controllable capacitor 562 connected to the second microstrip transmission line-to-slotline formation transition. At any given time, the capacitors 560, 562 may be controlled to have substantially the same capacitance value, or different capacitance values.

Figure 6:
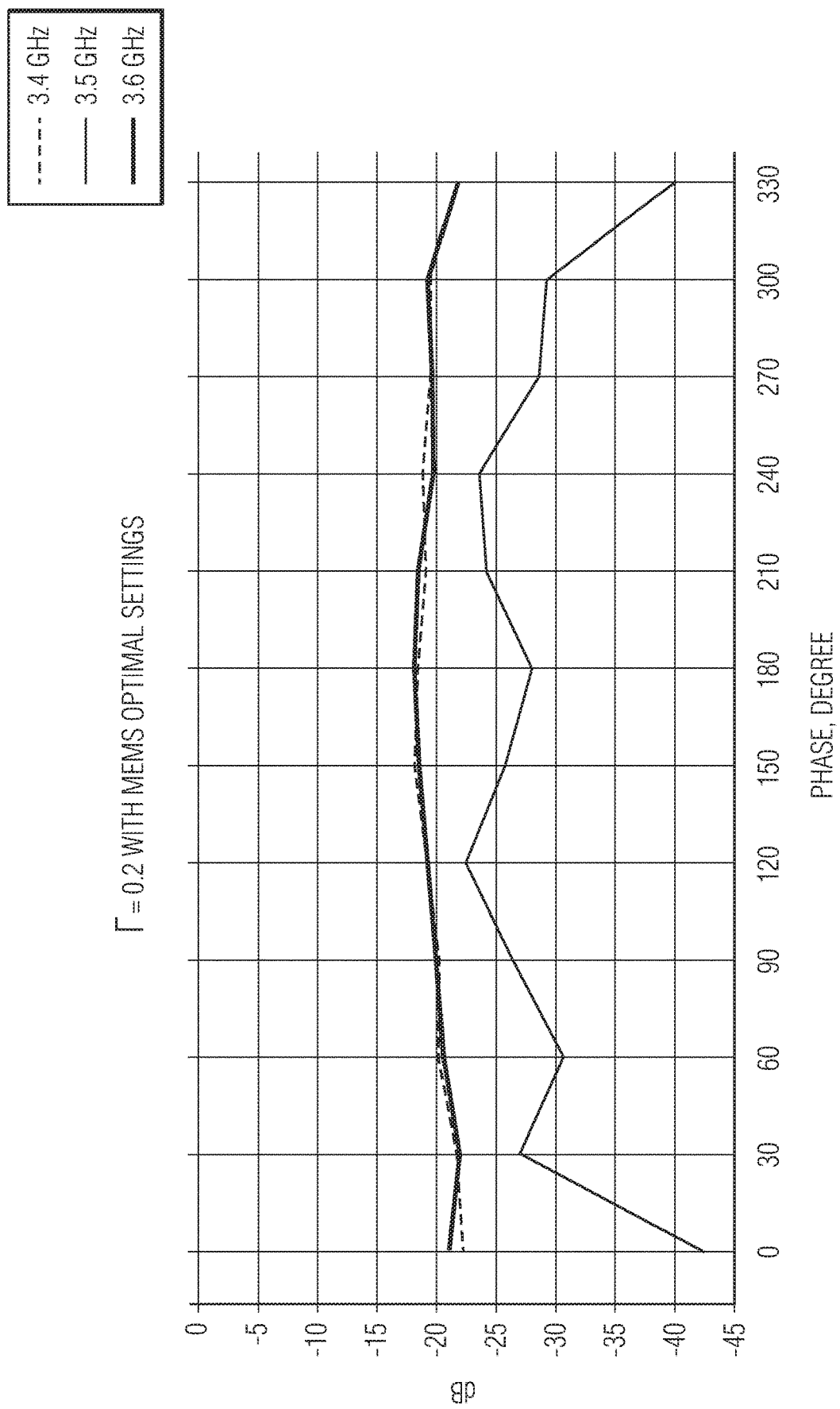
FIG. 6 is a graph of return loss (RL) in dB versus phase in degrees at a reflection coefficient, $\Gamma=0.2$, over a 360° phase angle at three radio frequencies, 3.4 GHz, 3.5 GHz, and 3.6 GHz.

FIG. 6 is a graph of return loss (RL) in decibels (dB) versus phase in degrees at a reflection coefficient, Γ=0.2, over a 360° phase angle at three radio frequencies, 3.4 GHz, 3.5 GHz, and 3.6 GHz. The graph of FIG. 6 shows that, under certain operating conditions and using an embodiment of the inventive subject matter, antenna mismatch equal to Γ=0.2 (RL=−20 lgΓ≈−14 dB) may be compensated to better than −25 dB (Γ<0.014) at 3.5 GHz and compensated to better than −20 dB (Γ<0.04) at the edges of 200 MHz bandwidth, e.g., at 3.4 GHz and 3.6 GHz.

Figure 7A:
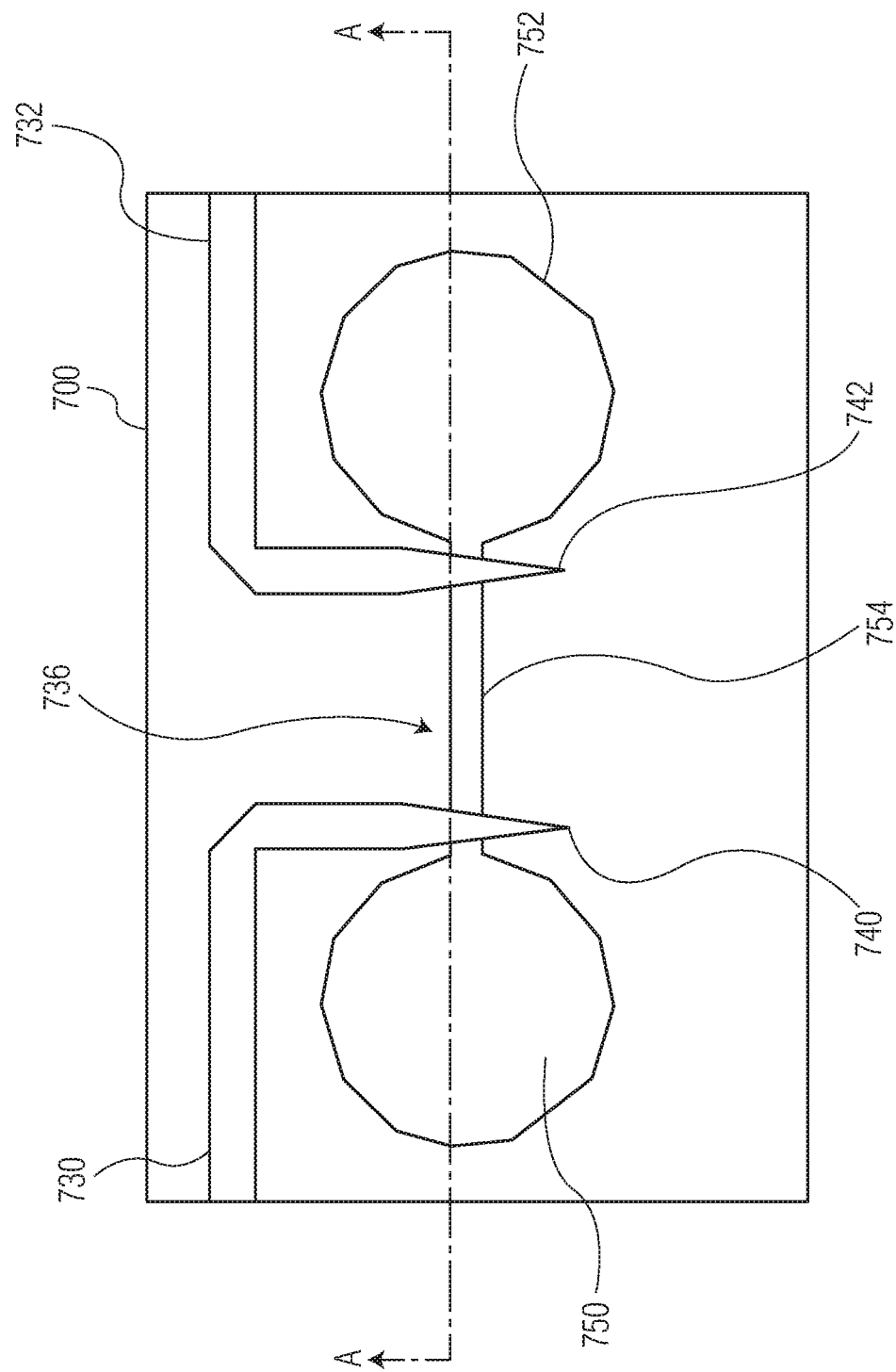
FIG. 7A is a top plan view of an example layout of a component that includes a first microstrip transmission line, a second microstrip transmission line, and a slotline formation in which the first microstrip transmission line and the second microstrip transmission line are on the same side of the component.

FIG. 7A is a top plan view of an example layout of a component 700 that includes a first microstrip transmission line 730 (e.g., microstrip transmission line 230), a second microstrip transmission line 732 (e.g., microstrip transmission line 232), and a slotline formation 736 (e.g., slotline formation 236) as described above relative to a footprint of the component. FIG. 7B is a side cutaway view of the component of FIG. 7A at cross section A-A. In the example of FIGS. 7A and 7B, the first and second microstrip transmission lines 730 and 732 are on the same side of the component (e.g., the first and second microstrip transmission lines are coplanar). For example, the first and second microstrip transmission lines 730 and 732 may be two conductive features of a first patterned conductive layer of a substrate (e.g., a PCB). From top to bottom, the cross-section of FIG. 7B shows that the PCB (or other substrate) includes a first patterned conductive layer 786 (that corresponds to the first and second microstrip transmission lines), a dielectric layer 788, a second patterned conductive layer 790 (that corresponds to the slotline formation), and a bottom dielectric layer 792. With reference to FIG. 7A, in an example embodiment, the component 700 is approximately 10 millimeters (mm)×6 mm and the microstrip transmission lines 730, 732 have a width of about 0.25 mm and a total length of about 15 mm, the elongated portion 754 of the slotline formation has a width in the range of about 0.25-0.3 mm and a length in the range of about 2.5-3 mm, and the shorted stubs 750, 752 of the slotline formation have a diameter of about 3.5 mm. In other embodiments, the actual or relative dimensions listed in the previous sentence may be smaller and/or larger. With reference to FIG. 7B, in an embodiment, the microstrip layer 786 is approximately 25 micrometers thick (vertical dimension), the dielectric layer 788 is approximately 75 micrometers thick, the conductive layer 790 of the slotline formation is approximately 20 micrometers thick, and the bottom dielectric layer 792 is approximately 200 micrometers thick with Dielectric Constant about $\varepsilon_r$=3.3. In other embodiments, the actual or relative dimensions or values listed in the previous sentence may be smaller and/or larger. Although FIGS. 7A and 7B depict a component 700 with certain footprint dimensions, in some other embodiments, the first and second microstrip transmission lines, the slotline formation, and the controllable capacitance circuit are integrated into a substrate (such as a PCB) that includes other components, for example, components of a RF front-end. In other words, component 700 may be a discrete component formed on a distinct substrate, or component 700 may be integrally formed in a PCB with other portions of an RF system.

Figure 8A:
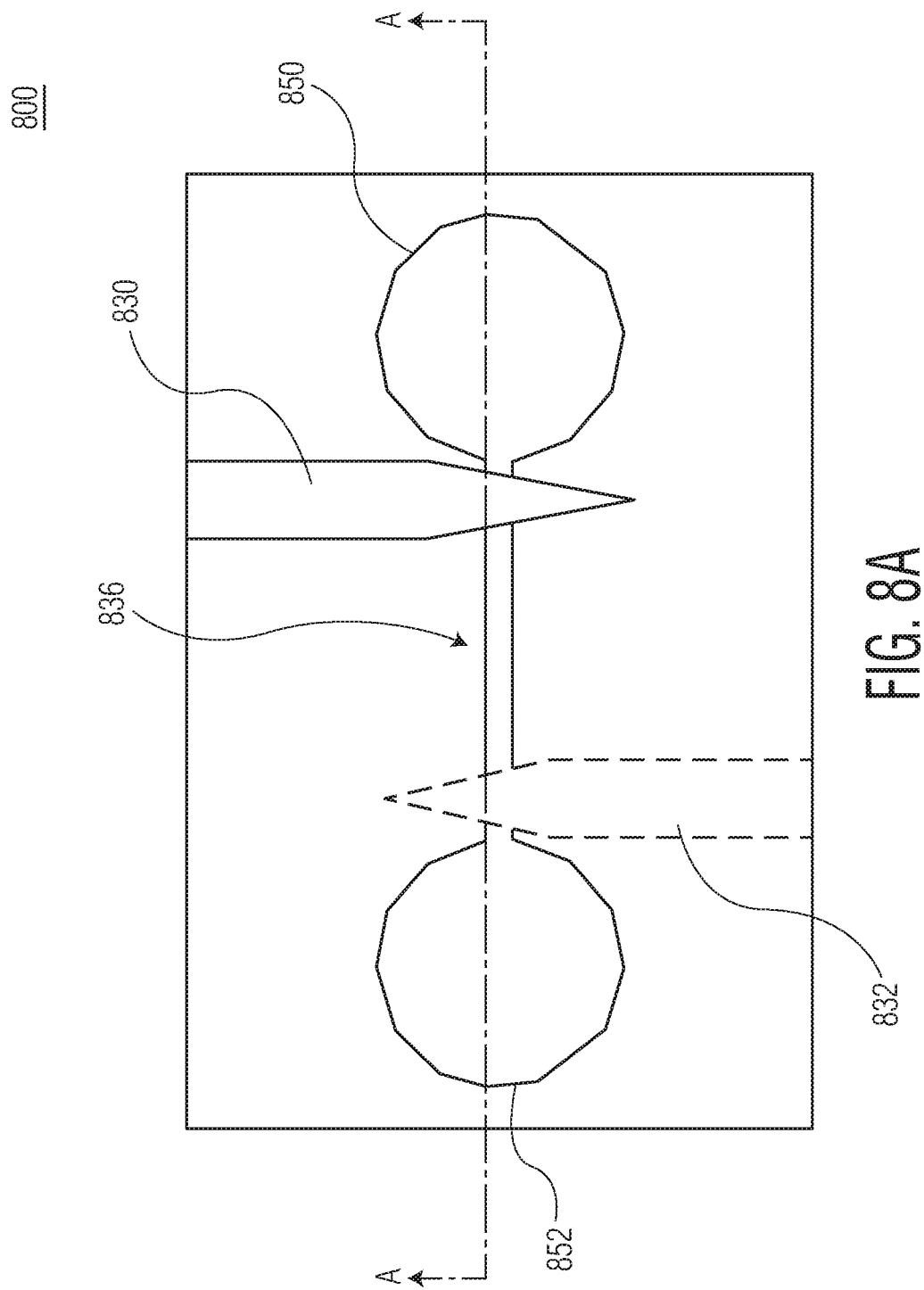
FIG. 8A is a top plan view of another example layout of a component that includes a first microstrip transmission line, a second microstrip transmission line, and a slotline formation in which the first microstrip transmission line and the second microstrip transmission line are not on the same side of the component.
Figure 8B:
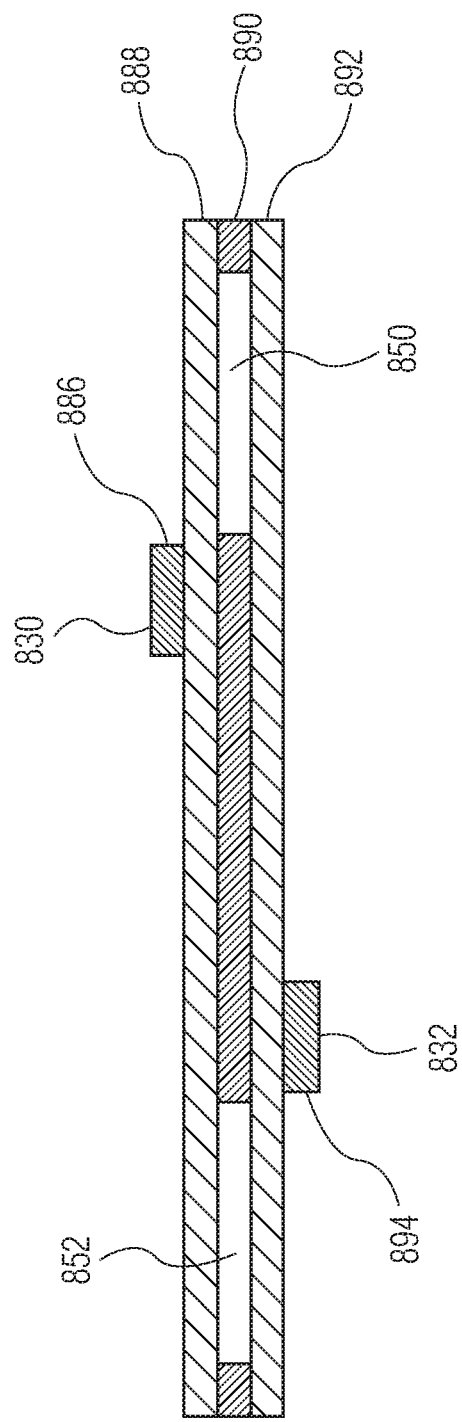
FIG. 8B is a side cutaway view of the component of FIG. 8A at cross section A-A.

FIG. 8A is a top plan view of an example layout of a component 800 that includes a first microstrip transmission line 830 (e.g., microstrip transmission line 230), a second microstrip transmission line 832 (e.g., microstrip transmission line 232), and a slotline formation 836 (e.g., slotline formation 236), in which the first microstrip transmission line and the second microstrip transmission line are not on the same side of the slotline formation 836. FIG. 8B is a side cutaway view of the component of FIG. 8A at cross section A-A. In the example of FIGS. 8A and 8B, the first and second microstrip transmission lines are on opposite sides of the component substrate (e.g., the first microstrip transmission line and the second microstrip transmission line are formed from conductive portions of different patterned conductive layers on different planes). For example, the first and second microstrip transmission lines 830 and 832 may be two conductive features of two different patterned conductive layers of a substrate (e.g., a PCB), and the slotline formation 836 may be formed in a third conductive layer of the substrate that is located between the two conductive layers that include the first and second microstrip transmission lines 830, 832. From top to bottom, the cross-section shows a first patterned conductive layer 886 (that corresponds to the first microstrip transmission line 830), a first dielectric layer 888, a second patterned conductive layer 890 (that corresponds to the slotline formation 836), a second dielectric layer 892, and a third patterned conductive layer 894 (that corresponds to the second microstrip transmission line 832). With reference to FIG. 8A, in an example embodiment, the component is approximately 10 mm×6 mm and the microstrip transmission lines have a width of about 0.25 mm and a total length of about 15 mm, the elongated portion of the slotline formation has a width in the range of about 0.25-0.3 mm and a length in the range of about 2.5-3 mm and the shorted stubs of the slotline formation have a diameter of about 3.5 mm. With reference to FIG. 8B, in an embodiment, the microstrip layers 886 and 894 are approximately 25 micrometers thick, the dielectric layer 888 is approximately 75 micrometers thick, the conductive layer 890 of the slotline formation is approximately 20 micrometers thick, and the bottom dielectric layer 892 is approximately 200 micrometers thick. In other embodiments, the actual or relative dimensions listed in the two previous sentences may be smaller and/or larger. Although the second microstrip transmission line is shown as exposed to an open environment, the second microstrip transmission line may be embedded in or surrounded by a dielectric layer with Dielectric Constant about $\varepsilon_r=3.3$, or some other value. Additionally, although FIGS. 8A and 8B depict a component with certain footprint dimensions, in some other embodiments, the first and second microstrip transmission lines, the slotline formation, and the controllable capacitance circuit are integrated into a substrate (such as a PCB) that includes other components, for example, components of a RF front-end. In other words, component 800 may be a discrete component formed on a distinct substrate, or component 800 may be integrally formed in a PCB with other portions of an RF system.

Figure 9:
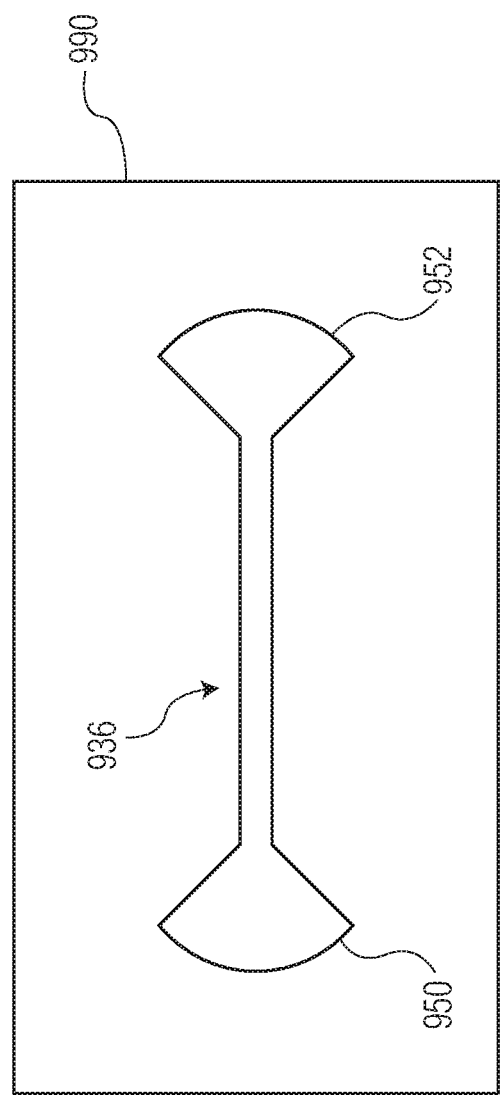
FIG. 9 is an example of a slot line formation in which the shorted stubs are radial shaped stubs.

FIG. 9 is an example of a slotline formation 936 in a conductive layer 990 in which shorted stubs 950 and 952 are radial shaped stubs. Slotline formation 936 may be used, for example, in place of the slotline formations illustrated in FIGS. 2, 3, 5, 7, and 8. In the example of FIG. 9, the radial shaped shorted stubs have a radial spread of about 90 degrees, although other radial spreads are possible.

Configurations of the microstrip transmission lines and/or slotline formation that are different from the configurations shown in FIGS. 7A-9 are possible. For example, configurations of the microstrip transmission lines may include only straight microstrip transmission lines and/or multi-arm stubs. Configurations of the slotline formation may include, for example, "Y" shaped shorted stubs, multi-arm stubs, or simply a uniform slotline.

As described above, employing a microstrip-to-slotline transition and a slotline-to-microstrip transition with controllable capacitance electrically connected to at least one of the microstrip transmission lines enables dynamic impedance compensation to be implemented with compact components in a manner that provides a wide dynamic range of adjustability over a wide frequency range. Some benefits of such a technique may include an increased range of impedance compensation, an increased instantaneous frequency band of impedance compensation, suppressed system gain at low frequencies due to filtering-shape frequency response, compactness of the impedance compensation system, RF power transfer from a power amplifier side substrate to an antenna side, galvanic isolation of the RF front-end from the antenna, and scaling to a higher output power.

Although the conductive layers of the microstrip transmission lines and the slotline formation are described as being separated by a dielectric layer, or dielectric layers, the microstrip transmission lines and the slotline formation alternatively may be separated from each other by open space that is filled with a gas, such as air. In an embodiment, an impedance compensation system implemented as described with reference to FIGS. 1-9 could be realized on a two-layer PCB or a multilayer PCB, or on any other substrate capable of operating at RF frequencies in the range of, for example, 800 MHz-6 GHz, not excluding lower or higher frequencies. Example performance parameters for a 5G wireless application may include: operation frequencies—band 42 (3.4-3.6 GHz); signal bandwidth—200 MHz; output power average—5 Watts; and load mismatch—14 dB return loss (RL). Performance parameters may be in different ranges and/or may be lower or higher, as well.

As already discussed above, the present disclosure is intended to encompass numerous embodiments in addition to those described herein in relation to any of FIGS. 1-9. For example, it is envisioned that numerous different embodiments can employ any of a variety of different types of slotline formations having any of a variety of configurations, sizes, and shapes, including end gap portions of different sizes and shapes. Although the several embodiments described above employ PCBs in which slotline formations are formed and multiple microstrip transmission lines are provided at layer(s) or level(s) above or below the slotline formations, the description of the microstrip transmission lines as being above or below the slotline formations is merely for convenience, and the microstrip transmission lines can also in other embodiments be positioned to the sides of the slotline formations, or be arranged in other different manners relative to the conductive layer in which the slotline formations are provided.

Also, as should be evident from FIGS. 1-9, the present disclosure is intended to encompass a variety of different embodiments and arrangements having any arbitrary number of layers, and/or having any of a variety of different types of input or output structures or components. For example, as already discussed above, in some embodiments a two-layer PCB is employed in which first and second patterned conductive layers are separated by a dielectric layer, one or more microstrip transmission lines are formed from portions of one of the conductive layers, and a slotline formation is formed from a removed portion of (or gap in) the other conductive layer. Also for example, in other embodiments, a multi-layer PCB having more than two conductive layers with dielectric layers positioned therebetween (e.g., a PCB with first, second, and third conductive layers, a first dielectric layer positioned between the first and second conductive layers, and a second dielectric layer positioned between the second and third conductive layers) can be employed. In such embodiments, a slotline formation can be provided in any one of the conductive layers (or possibly multiple slotline formations can be provided in one or more of the conductive layers). Further for example, it should be appreciated that, depending upon the embodiment, any of the embodiments of FIGS. 1-9 can be implemented (or modified to be implemented) on either a two-layer PCB or a multi-layer PCB. Further still, it should be appreciated that, depending upon the embodiment, any of the embodiments of FIGS. 1-9 can be implemented (or modified to be implemented) in substrates other than PCB-type substrates, such as multi-layer ceramic substrates (e.g., co-fired ceramic substrates), semiconductor material substrates, and so on.

Figure 10:
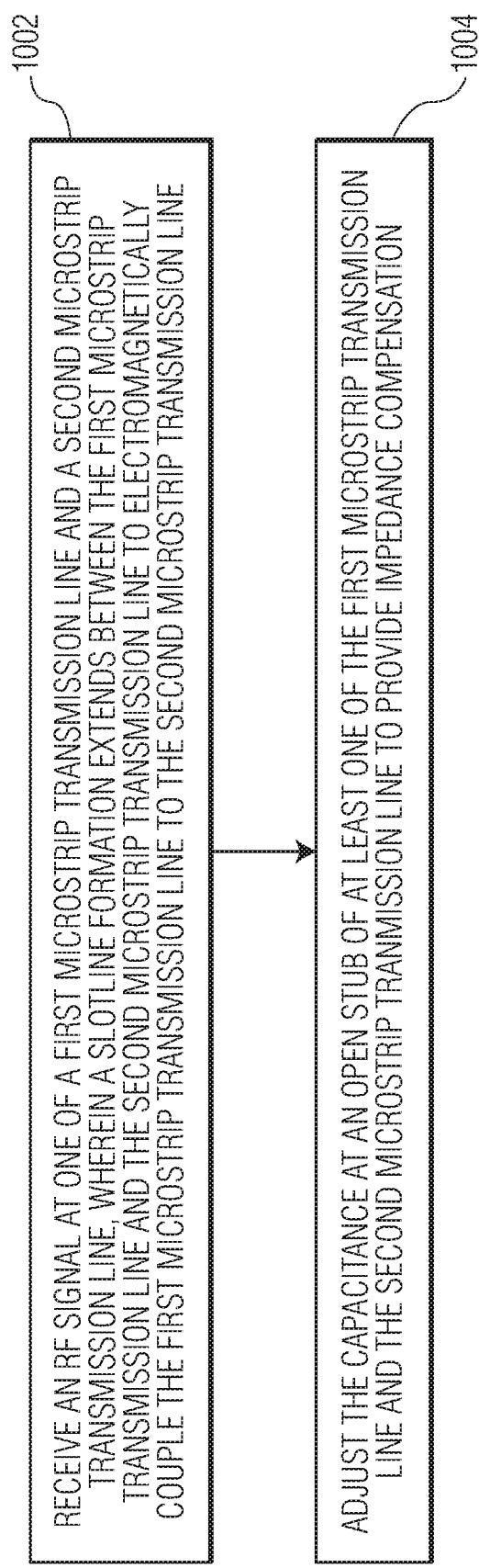
FIG. 10 is a process flow diagram of a method for providing impedance compensation for an RF front-end.

FIG. 10 is a process flow diagram of a method for providing impedance compensation for an RF front-end. According to the method, at block 1002, an RF signal is received at one of a first microstrip transmission line and a second microstrip transmission line, wherein a slotline formation extends between the first microstrip transmission line and the second microstrip transmission line to electromagnetically couple the first microstrip transmission line to the second microstrip transmission line. At block 1004, the capacitance at an open stub of at least one of the first microstrip transmission line and the second microstrip transmission line is adjusted to provide impedance compensation. In an embodiment of the method, adjusting the capacitance at an open stub of at least one of the first microstrip transmission line and the second microstrip transmission line involves adjusting the capacitance at a first controllable capacitance circuit (or variable capacitor) that is electrically connected to an open stub of the first microstrip transmission line in response to receiving a first capacitance control signal, and adjusting the capacitance at a second controllable capacitance circuit (or variable capacitor) that is electrically connected to an open stub of the second microstrip transmission line in response to receiving a second capacitance control signal.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A circuit comprising:
    a first microstrip transmission line;
    a second microstrip transmission line;
    a slotline formation,
    wherein the slotline formation extends between the first microstrip transmission line and the second microstrip transmission line to so that the slotline formation is configured to electromagnetically couple the first microstrip transmission line to the second microstrip transmission line during operation of the circuit; and
    at least one controllable capacitance circuit electrically connected to at least one of the first microstrip transmission line and the second microstrip transmission line, wherein a magnitude of capacitance of the at least one controllable capacitance circuit is controllable;
    wherein the at least one controllable capacitance circuit comprises:
        a first controllable capacitance circuit electrically connected to the first microstrip transmission line and including a first control interface, wherein a magnitude of capacitance of the first controllable capacitance circuit is controllable in response to a first capacitance control signal received at the first control interface; and
        a second controllable capacitance circuit electrically connected to the second microstrip transmission line and including a second control interface, wherein a magnitude of capacitance of the second controllable capacitance circuit is controllable in response to a second capacitance control signal received at the second control interface.

2. The circuit of claim 1, wherein:
    the first microstrip transmission line includes an open stub, and the first controllable capacitance circuit is electrically connected to the first microstrip transmission line at the open stub of the first microstrip transmission line; and
    the second microstrip transmission line includes an open stub, and the second controllable capacitance circuit is electrically connected to the second microstrip transmission line at the open stub of the second microstrip transmission line.

3. The circuit of claim 1, wherein the at least one controllable capacitance circuit is controlled in response to a digital capacitance control signal received at a control interface of the at least one controllable capacitance circuit.

4. The circuit of claim 1, wherein the at least one controllable capacitance circuit comprises:
    a first digitally controllable capacitance circuit electrically connected to the first microstrip transmission line and including a first control interface, wherein a magnitude of capacitance of the first digitally controllable capacitance circuit is controllable in response to a first digital capacitance control signal received at the first control interface; and
    a second digitally controllable capacitance circuit electrically connected to the second microstrip transmission line and including a second control interface, wherein a magnitude of capacitance of the second digitally controllable capacitance circuit is controllable in response to a second digital capacitance control signal received at the second control interface.

5. The circuit of claim 1, wherein a portion of the first microstrip transmission line intersects a portion of the slotline formation from a plan view perspective, and wherein a portion of the second microstrip transmission line intersects a portion of the slotline formation from a plan view perspective.

6. The circuit of claim 5, wherein:
    the first microstrip transmission line includes an open stub, and the first microstrip transmission line intersects the portion of the slotline formation near the open stub of the first microstrip transmission line; and
    the second microstrip transmission line includes an open stub, and the second microstrip transmission line intersects the portion of the slotline formation near the open stub of the second microstrip transmission line.

7. The circuit of claim 5, wherein the intersecting portions of the first microstrip transmission line and the slotline formation are separated by a dielectric layer, and wherein the intersecting portions of the second microstrip transmission line and the slotline formation are separated by a dielectric layer.

8. The circuit of claim 7, further comprising a printed circuit board (PCB), wherein the slotline formation is formed as a gap in a conductive layer of the PCB.

9. The circuit of claim 8, wherein a linear portion of the gap of the slotline formation extends perpendicular to a portion of the first microstrip transmission line and to a portion of the second microstrip transmission line.

10. The circuit of claim 9, wherein the gap of the slotline formation includes a first rounded end portion at a first end of the linear portion, and a second rounded end portion at a second end of the linear portion.

11. The circuit of claim 1, wherein the first microstrip transmission line includes an L-shaped portion with a first linear portion and a second linear portion that is substantially perpendicular to the first linear portion, and wherein the second microstrip transmission line includes an L-shaped portion with a third linear portion and a fourth linear portion that is substantially perpendicular to the third linear portion.

12. The circuit of claim 11, wherein:
the first microstrip transmission line includes an open stub, and the first microstrip transmission line intersects a portion of the slotline formation near the open stub of the first microstrip transmission line; and
the second microstrip transmission line includes an open stub, and the second microstrip transmission line intersects a portion of the slotline formation near the open stub of the second microstrip transmission line.

13. The circuit of claim 1, wherein the first microstrip transmission line and the second microstrip transmission line are coplanar.

14. The circuit of claim 1, wherein the first microstrip transmission line and the second microstrip transmission line are on different planes.

15. A radio frequency (RF) front-end comprising the circuit of claim 1.

16. A system comprising:
a first microstrip transmission line;
a second microstrip transmission line;
a slotline formation,
wherein the slotline formation extends between the first microstrip transmission line and the second microstrip transmission line to electromagnetically couple the first microstrip transmission line to the second microstrip transmission line; and
at least one controllable capacitance circuit electrically connected to at least one of the first microstrip transmission line and the second microstrip transmission line and including a control interface, wherein a magnitude of capacitance of the at least one controllable capacitance circuit is controllable in response to a capacitance control signal received at the control interface; wherein the at least one controllable capacitance circuit comprises:
a first controllable capacitance circuit electrically connected to the first microstrip transmission line and including a first control interface wherein a magnitude of capacitance of the first controllable capacitance circuit is controllable in response to a first capacitance control signal received at the first control interface; and
a second controllable capacitance circuit electrically connected to the second microstrip transmission line and including a second control interface, wherein a magnitude of capacitance of the second controllable capacitance circuit is controllable in response to a second capacitance control signal received at the second control interface.

17. A method for providing impedance compensation for a radio frequency (RF) front-end, the method comprising:
receiving an RF signal at one of a first microstrip transmission line and a second microstrip transmission line, wherein a slotline formation extends between the first microstrip transmission line and the second microstrip transmission line to electromagnetically couple the first microstrip transmission line to the second microstrip transmission line; and
adjusting a capacitance at an open stub of at least one of the first microstrip transmission line and the second microstrip transmission line to provide impedance compensation; wherein adjusting the capacitance at the open stub of at least one of the first microstrip transmission line and the second microstrip transmission line comprises:
adjusting the capacitance at a first controllable capacitance circuit that is electrically connected to an open stub of the first microstrip transmission line in response to receiving a first capacitance control signal; and
adjusting the capacitance at a second controllable capacitance circuit that is electrically connected to an open stub of the second microstrip transmission line in response to receiving a second capacitance control signal.

* * * * *